United States Patent
Martinelli

(10) Patent No.: US 9,276,476 B1
(45) Date of Patent: Mar. 1, 2016

(54) FORCED COMMUTATING A CURRENT THROUGH A DIODE

(75) Inventor: Robert Matthew Martinelli, Murrieta, CA (US)

(73) Assignee: THE BOEING COMPANY, Chicago, IL (US)

( * ) Notice: Subject to any disclaimer, the term of this patent is extended or adjusted under 35 U.S.C. 154(b) by 1303 days.

(21) Appl. No.: 12/882,485

(22) Filed: Sep. 15, 2010

(51) Int. Cl.
  *G05F 1/00* (2006.01)
  *H02M 3/158* (2006.01)

(52) U.S. Cl.
  CPC .......... *H02M 3/1588* (2013.01); *Y02B 70/1441* (2013.01); *Y02B 70/1491* (2013.01)

(58) Field of Classification Search
  CPC .......... H01L 2924/12032; H02M 1/32; H02M 3/158; H02M 7/5387; H02M 3/1588; H02M 3/33569; H02P 7/0044
  USPC ........... 323/282–283; 363/108, 123, 125, 127
  See application file for complete search history.

(56) References Cited

U.S. PATENT DOCUMENTS

| | | | |
|---|---|---|---|
| 5,321,596 A | 6/1994 | Hurst | |
| 5,726,869 A | 3/1998 | Yamashita et al. | |
| 5,872,705 A | 2/1999 | Loftus, Jr. et al. | |
| 5,907,481 A | 5/1999 | Svardsjo | |
| 5,999,420 A | 12/1999 | Aonuma et al. | |
| 6,046,516 A * | 4/2000 | Maier et al. | 307/125 |
| 6,696,772 B2 | 2/2004 | Nieminen | |
| 2002/0113581 A1* | 8/2002 | Eagar et al. | 323/282 |
| 2005/0184716 A1 | 8/2005 | Brown | |
| 2005/0242795 A1 | 11/2005 | Al-Kuran et al. | |
| 2005/0286272 A1* | 12/2005 | Iwamoto et al. | 363/21.01 |
| 2007/0080674 A1* | 4/2007 | Gray et al. | 323/282 |
| 2008/0084197 A1 | 4/2008 | Williams et al. | |
| 2009/0206812 A1* | 8/2009 | Sasaya et al. | 323/282 |
| 2010/0253312 A1* | 10/2010 | Morimoto | 323/312 |
| 2010/0321966 A1* | 12/2010 | Mochikawa et al. | 363/123 |

* cited by examiner

*Primary Examiner* — Adolf Berhane
*Assistant Examiner* — Henry Lee, III
(74) *Attorney, Agent, or Firm* — Patterson & Sheridan, LLP

(57) ABSTRACT

Technologies are described herein for force commutating a current from a cathode terminal of a diode to an anode terminal of the diode. In one aspect, a method for eliminating diode reverse recovery time is presented herein. The method includes force commutating a current from a cathode terminal of a diode to an anode terminal of the diode. According to embodiments, the diode may be an intrinsic part of a component, such as a field effect transistor (FET). In such embodiments, the FET is switched from being on to off while force commutating a current through the body diode of the FET.

17 Claims, 3 Drawing Sheets

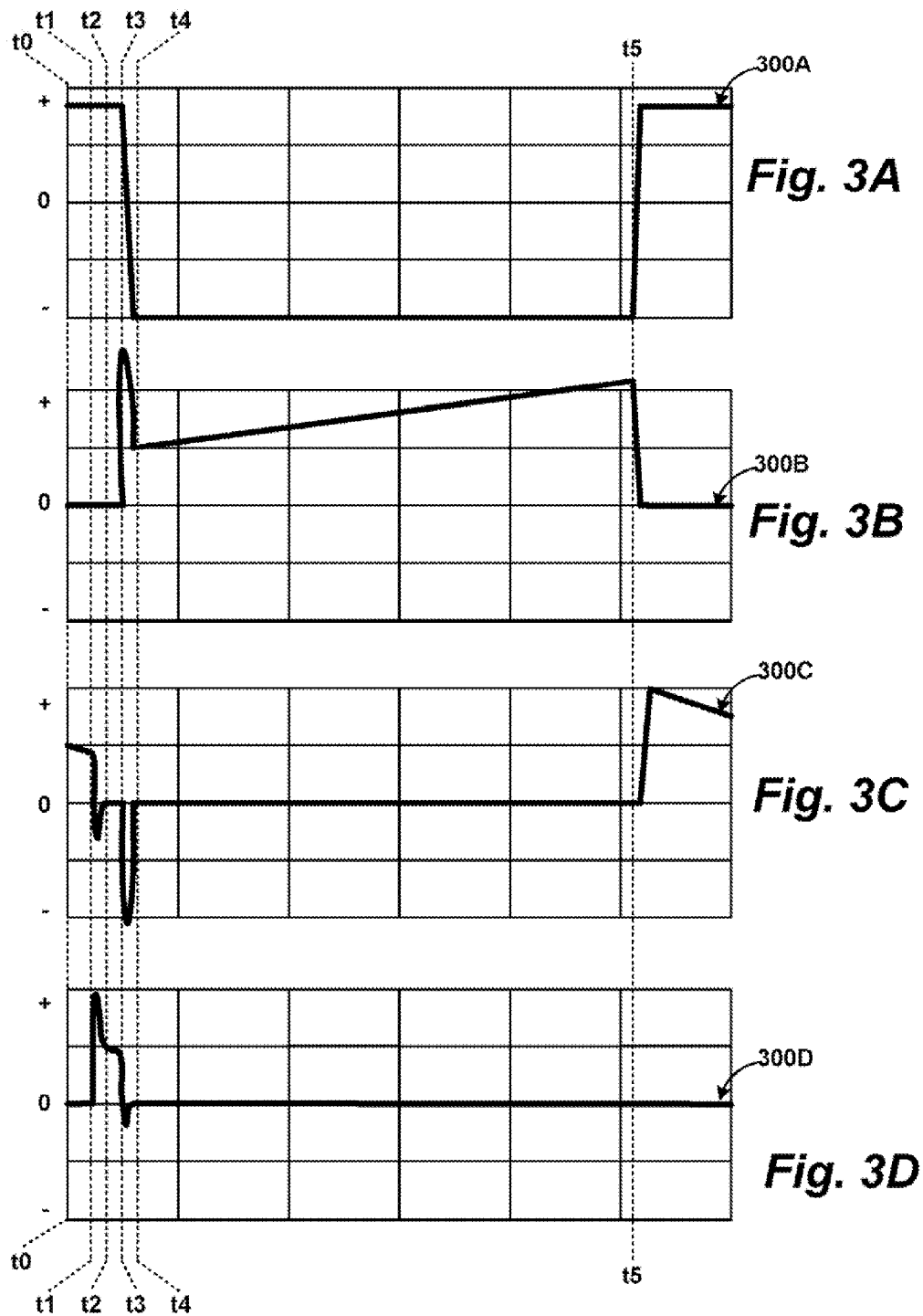

FORCED COMMUTATING A CURRENT THROUGH A DIODE

BACKGROUND

Synchronous rectification replaces a traditional rectifier with a Field Effect Transistor (FET) switch. This reduces power dissipation as the forward voltage drop in the FET switch is much lower than the forward voltage drop of a rectifier. However, the reverse recovery time of the FET body diode in higher voltage applications (e.g. greater than about 60 Volts, >60V) is substantial. Therefore, switching losses can be quite high and the switching frequency of the power supply can be limited.

Most of the prior improvements addressing this problem have been driven by FET manufacturers. In the recent past, the reverse recovery time of the body diode in low voltage FET switches has improved significantly. However, the reverse recovery time of the body diode in high voltage FET switches still remains too high, causing extensive switching losses. One solution that tackles the extensive switching losses is to package a Schottky diode in parallel with the FET switch. However, this solution may not be effective for 100V to 200V applications since the forward drop of the FET body diode is comparable to the forward drop of the Schottky diode. Therefore, some current remains in the body diode when the FET is switched off, such that the FET switch still has a significant associated reverse recovery time, resulting in reduced, but intolerable switching losses.

It is with respect to these considerations and others that the disclosure made herein is presented.

SUMMARY

Technologies are described herein for eliminating reverse recovery losses caused by the slow recovery of the body diode of a switch used in high voltage circuit topologies. The losses are eliminated by forcing current through the switch from cathode to anode just before turning the switch off. Therefore, since no current flows in the body diode in the forward bias, the recovery time due to current flow is reduced to zero.

Through the utilization of the technologies and concepts presented herein, a reverse recovery time associated with a switching component, such as a Field Effect Transistor (FET), that has an intrinsic body diode is eliminated by forcing current through a commutation diode such that the current in the switch is reversed before turning the switch off. Once the current is flowing in the switch in the opposite direction of the body diode, the switch can be turned off and no current will flow in the body diode. Meanwhile, the current flowing through the switch from cathode to anode continues to flow in the commutation diode path.

In one embodiment, a method for eliminating diode reverse recovery time of a diode is presented herein. The method includes force commutating a current in a component associated with a diode from a cathode terminal of the diode to an anode terminal of the diode while switching off the component associated with the diode. According to embodiments, the diode may be a body diode that is an intrinsic part of the component, such as a FET. In such embodiments, the FET is switched from being on to off while force commutating a current through the switch that reverse biases the body diode of the FET.

In another embodiment, a synchronous rectifier includes a field effect transistor (FET) that includes a gate terminal, a drain terminal, a source terminal, and an intrinsic body diode having a cathode terminal and an anode terminal, the synchronous rectifier further includes a commutation diode electrically coupled in parallel to the FET such that a cathode of the commutation diode is electrically coupled to the cathode terminal of the body diode, and a selectively controlled force commutation current source electrically coupled to the commutation diode that is configured to force commutate a current from the commutation diode to the FET switch while the FET switch is switched on, such that the current passes from the cathode terminal of the body diode to the anode terminal of the body diode.

In yet another embodiment, a force commutation assembly includes a switching component that includes an intrinsic body diode having a cathode terminal and an anode terminal, a commutation diode electrically coupled in parallel to the switching component such that a cathode of the commutation diode is electrically coupled to the cathode terminal of the body diode, and a selectively controlled force commutation current source electrically coupled to the commutation diode that is configured to force commutate a current from the commutation diode to the switching component while the switching component is switching off.

It should be appreciated that the above-described subject matter may also be implemented in various other embodiments without departing from the spirit of the disclosure. These and various other features will be apparent from a reading of the following Detailed Description and a review of the associated drawings.

This Summary is provided to introduce a selection of concepts in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 3A shows a waveform diagram representing the current and voltage measured at a particular node of the boost converter circuit shown in FIG. 2, in accordance with some embodiments;

FIG. 3B shows a waveform diagram representing the current and voltage measured at a drain terminal of a low-side field effect transistor of the boost converter circuit shown in FIG. 2, in accordance with some embodiments;

FIG. 3C shows a waveform diagram representing the current and voltage measured at a source terminal of a high-side field effect transistor of the boost converter circuit shown in FIG. 2, in accordance with some embodiments; and FIG. 3D shows a waveform diagram representing the current and voltage measured at an anode terminal of a commutation diode of the boost converter circuit shown in FIG. 2, in accordance with some embodiments.

DETAILED DESCRIPTION

Figure 1:
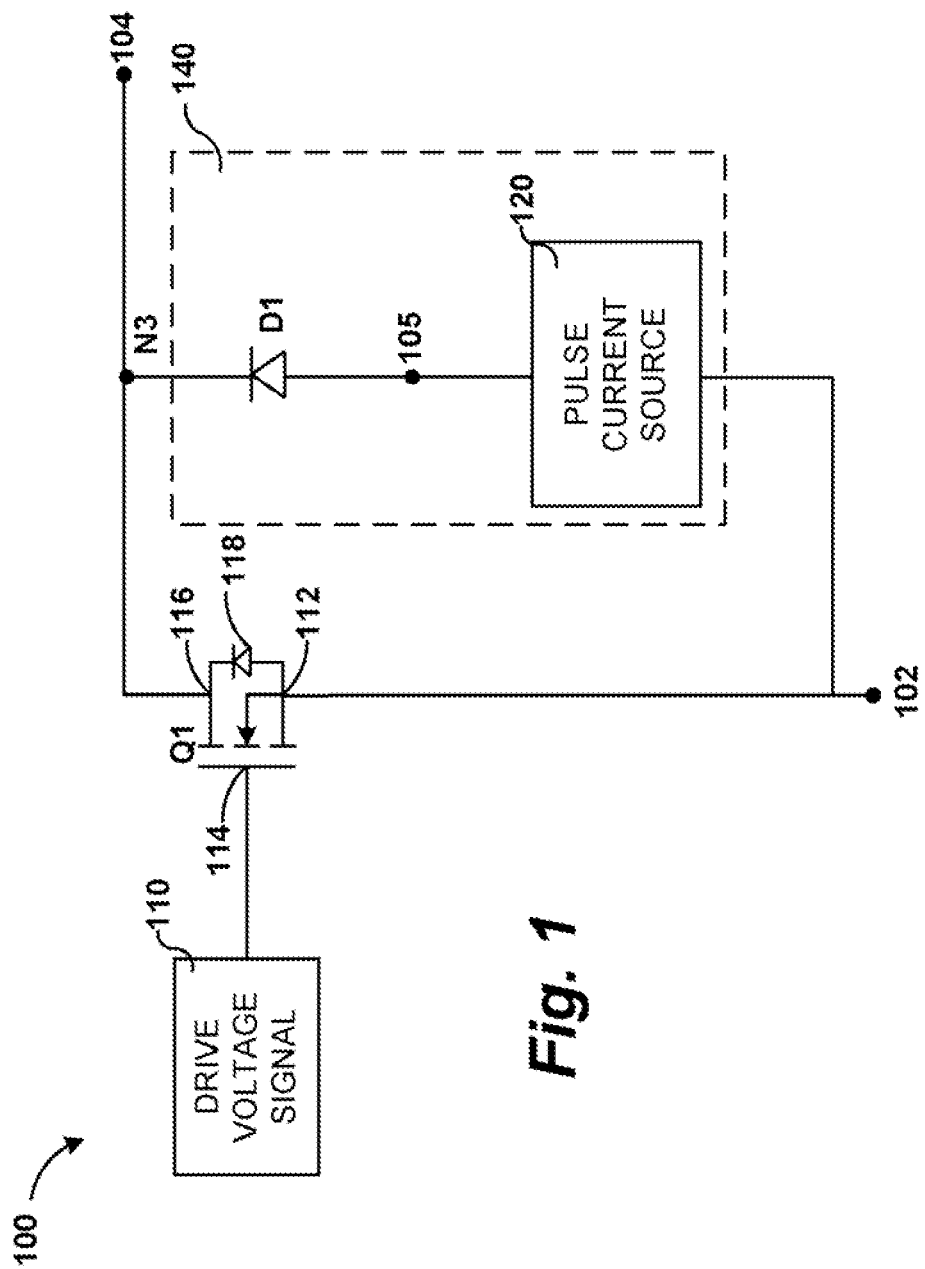
FIG. 1 is a schematic diagram of a circuit including a force commutation assembly, in accordance with some embodiments.

Technologies are described herein for eliminating reverse recovery losses caused by the slow recovery of the body diode of a switch used as a synchronous rectifier. The losses are eliminated by forcing current through the switch from cathode to anode just before turning the switch off. Therefore since no current flows in the body diode, the recovery time is reduced to zero.

Through the utilization of the technologies and concepts presented herein, a reverse recovery time associated with a switching component, such as a Field Effect Transistor (FET), that has an intrinsic body diode is eliminated by forcing current through a commutation diode such that the current in the switch is reversed before turning the switch off. Once the current is flowing in the switch in the opposite direction of the body diode, the switch can be turned off and no current will flow in the body diode. Meanwhile the current flowing through the switch from the cathode to anode continues to flow in the commutation diode path.

In the following detailed description, references are made to the accompanying drawings that form a part hereof and that are shown by way of illustration, specific embodiments or examples. Referring now to the drawings, in which like numerals represent like elements through the several figures, technologies for force commutating a current through a diode according to the various embodiments will be described.

FIG. 1 is a schematic diagram of a circuit including a force commutation assembly, in accordance with some embodiments. In particular, FIG. 1 shows a force commutation assembly 100 including a switching component, such as a field effect transistor (FET) Q1 electrically coupled to a force commutation circuit 140. The FET Q1 includes a source terminal 112, a gate terminal 114, and a drain terminal 116. The FET Q1 also has an intrinsic body diode 118. The FET Q1 shown in FIG. 1 is an n-type FET, and therefore, the anode of the body diode is connected to the source terminal and the cathode of the body diode 118 is connected to the drain terminal. In embodiments where the FET Q1 is a p-type FET, the direction of the body diode is reversed, such that the cathode of the body diode is connected to the source terminal of the p-type FET and the anode of the body diode is connected to the drain terminal of the p-type FET. While the present disclosure utilizes an n-type FET as an example, it should be appreciated that the FET Q1 may represent any switching component, such as an n-type FET, a p-type FET, or a switch, that includes an intrinsic body diode that may have an associated reverse recovery time. In one embodiment, the switching component may be a rectifier switch used in power supply topologies.

Typically, n-type FETs allow a current to flow between the source terminal and the drain terminal when the gate terminal is supplied with a voltage greater than a threshold voltage associated with switching on the FET. When the voltage supplied to the gate terminal is reduced to below the threshold voltage or is removed completely, the FET is switched off and the current flowing between the source terminal and the drain terminal stops flowing. If the current is flowing from the source terminal to the drain terminal when the FET is switched off, the body diode of the FET requires a period of time to recover since the current was flowing in the forward-bias direction of the body diode. This is called the reverse recovery time. However, if the current is flowing from the drain terminal to the source terminal when the FET is switched off, there is no reverse recovery time needed since the current was already flowing in the reverse-bias direction of the body diode. Using the concepts described above, the reverse recovery time of a diode can be eliminated by forcing a commutation current from a cathode terminal of a diode to an anode terminal of the diode during the switch-off event associated with the FET.

The gate terminal of the FET Q1 is electrically coupled to a drive voltage signal 110, which controls the switching of the FET. When the drive voltage source provides a threshold voltage to the gate terminal, the FET Q1 is switched on. When the gate terminal of the FET does not have a voltage, the FET Q1 is switched off. A current is configured to flow into the source terminal of the FET Q1 through an input terminal 102, while the current flowing out of the FET Q1 flows towards an output terminal 104.

As described above, the FET Q1 is electrically coupled to the force commutation circuit 140. The force commutation circuit 140 includes a pulse current source 120 and a commutation diode D1. The pulse current source 120 may be configured to generate a commutation current that is configured to be larger than the current entering through the input terminal 102. In one embodiment, the commutation current is characterized as a pulse current that is supplied from the force commutation assembly 100 for a very brief period of time. The pulse current source 120 is electrically coupled to an anode terminal of the commutation diode D1 at terminal 105.

The commutation diode D1 includes an anode terminal, which is electrically coupled to the pulse current source 120 at terminal 105. The commutation diode D1 also includes a cathode terminal, which is electrically coupled to the drain terminal of the FET Q1 and the output terminal 104 at node N3. In this way, the commutation diode is in parallel with the FET Q1. It should be appreciated that the commutation diode D1 should be arranged in such a manner that the cathode terminal of the commutation diode D1 should be connected to the cathode terminal of the body diode 118.

The force commutation assembly 100 may operate in four phases. In the first phase, both the FET Q1 is switched off and the pulse current source is switched off such that the pulse current source is not supplying a commutation current. In this phase, input current enters the force commutation assembly 100 at the input terminal 102, flows through the commutation diode D1, and outputs the force commutation assembly 100 at the output terminal 104.

In the second phase, the FET Q1 is switched on and the pulse current source remains off. In this phase, input current enters at the input terminal 102 and flows through the FET Q1 from the source terminal 112 to the drain terminal 116, and exits through terminal 104. The current no longer flows through the commutation diode D1 since the voltage drop across the FET Q1 is smaller than the forward voltage of the commutation diode D1.

In the third phase, while the FET Q1 is on, the pulse current source is switched on. In this phase, input current enters the force commutation assembly 100 at the input terminal 102, and flows through the pulsed current source and commutation diode D1. In addition, the pulse current source 120 supplies a commutation current that flows through the commutation diode D1 and the FET Q1. At the node N3, the input current flows to the output terminal, while the commutation current passes through the FET Q1 from the drain terminal 116 to the source terminal 112. Current now flows from the drain terminal 116 to the source terminal 112 of the FET Q1.

In the fourth phase, the FET Q1 is switched off while the commutation current is flowing through the FET Q1 from the drain terminal 116 to the source terminal 112. In this phase, the commutation current stops flowing and the input current flows through the commutation diode D1 and outputs at the output terminal 104. To eliminate the reverse recovery time associated with the body diode of the FET Q1, the FET Q1 should be switched off while a current is flowing through the FET Q1 from the drain terminal to the source terminal (opposite the direction of the body diode). In a rectifier switch circuit that includes an FET switch, to eliminate reverse recovery time due to current flow, the commutation current passes through the FET switch during a switch-off edge of the rectifier switch circuit. The switch-off edge of the rectifier switch circuit is the duration of time that the FET switch is switched off By following the sequence of events delineated by the four phases, the FET Q1 is switched off while the commutation current is flowing through the FET Q1 from the drain terminal 116 to the source terminal 112. Accordingly, the reverse recovery time associated with the FET Q1 is eliminated.

The force commutation assembly 100 described above may be utilized as a building block for a variety of applications. In particular, switching applications that utilize a switching component that includes a body diode may perform more efficiently through the utilization of the force commutation assembly described above. In addition, switching regulators, such as buck converters, boost converters, and buck-boost converters, may also utilize the force commutation assembly described above.

Conventional switching regulators may use a rectifier to provide a current path during for the inductor current during the off time of the main FET. With modern improvements, it has become practical to replace a rectifier with FET switches as the reverse recovery time of the FET switches have become quite small with very little power dissipated as a result. However, in high voltage applications, such as voltages greater than about 60V, reverse recovery times are relatively substantial, causing significant power dissipation as well as limits on the switching frequency of the FET. To eliminate the reverse recovery time of an intrinsic body diode of a FET being utilized as a rectifier in high voltage switching regulator applications, such as a boost converter, a conventional rectifier or synchronous switched FET may be replaced with the force commutation assembly 100 described in FIG. 1. In rectification applications involving a switch, the rectification cycles through the four phases described above. This cycle may be referred to as a rectifier switch cycle. The fourth phase occurs at the switch-off edge of the rectifier switch cycle. In high voltage rectifier applications, the voltage applied to the switch, such as the FET, may be greater than 60 V.

Figure 2:
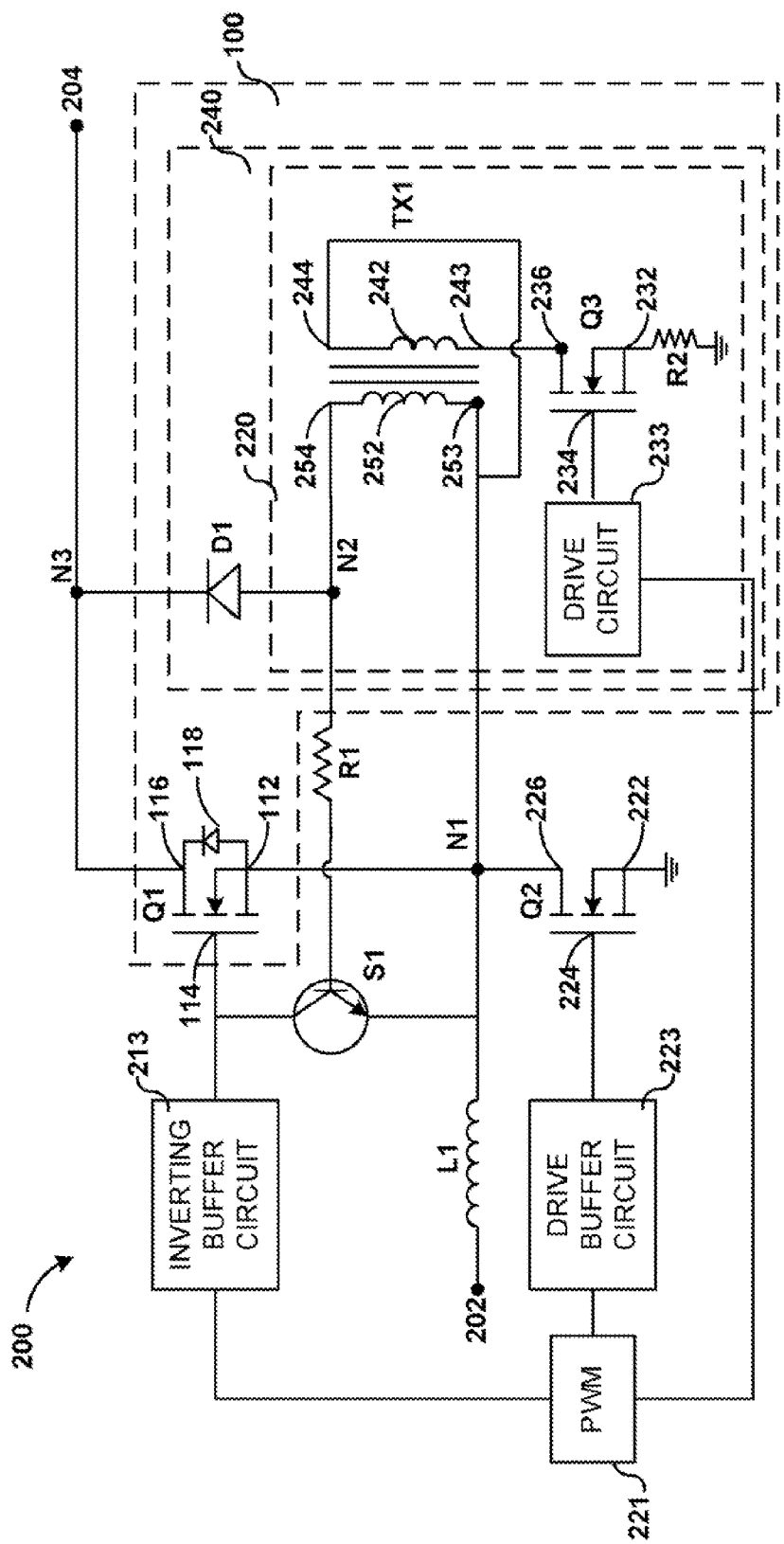
FIG. 2 is a schematic diagram of a boost converter circuit implementing the force commutation assembly shown in FIG. 1, in accordance with some embodiments.

FIG. 2 is a schematic diagram of a boost converter circuit implementing the force commutation assembly shown in FIG. 1, in accordance with some embodiments. Although the present disclosure generally describes technologies for eliminating the reverse recovery time of a diode, the present disclosure is described in context of a boost converter that could be used to regulate a high voltage bus. It should be appreciated that a force commutation assembly can be used to replace a conventional switch in most power supply topologies, and that the circuit described herein is only intended to put the invention in the context of a particular application for clarity of understanding.

As shown in FIG. 2, a boost converter 200 is configured to convert an input voltage supplied at an input terminal 202 to a higher voltage at an output terminal 204. The boost converter 200 includes the force commutation assembly 100, a low-side FET Q2, and an inductor L1. It should be appreciated that the FET Q1 shown in the force commutation assembly 100 in FIGS. 1 and 2 will be referred to as a high-side FET Q1, when discussed in the context of a boost converter.

As described above with respect to FIG. 1, the high-side FET Q1 includes a source terminal 112, a gate terminal 114, and a drain terminal 116. The high-side FET Q1 also includes an intrinsic body diode 118. The low-side FET Q2 includes a source terminal 222 electrically coupled to ground, a gate terminal 224, and a drain terminal 226 electrically coupled to the source terminal 212 of the high-side FET Q1 at a node N1. According to embodiments, the high-side FET Q1 and the low-side FET Q2 may be n-type MOSFET switches.

The inductor L1 has a first inductor terminal 106 that is electrically coupled to the input terminal 202. The inductor L1 also has a second inductor terminal 108 that is electrically coupled to the source terminal 112 of the high-side FET Q1 and the drain terminal 226 of the low-side FET Q2 at the node N1.

A pulse width modulator (PWM) 221 provides an input pulse to intermediate circuits for controlling the low-side FET Q2 and the high-side FET Q1. The input pulse is supplied to a drive buffer circuit 223, which generates a low-side voltage that is supplied to the gate terminal 224 of the low-side FET Q2 for switching on the low-side FET Q2. When the low-side voltage supplied to the gate terminal 224 of the low-side FET Q2 is greater than a threshold gate to source voltage of the low-side FET Q2, the low-side FET Q2 is switched on.

The pulse width modulator 221 may also supply the input pulse to an inverting buffer circuit 213. The inverting buffer circuit 213 is configured to generate a high-side voltage that is supplied to the gate terminal 114 of the high-side FET Q1. When the high-side voltage supplied to the gate terminal 114 of the high-side FET Q1 is greater than a threshold gate to source voltage of the high-side FET Q1, the high-side FET Q1 is switched on. To prevent "shoot through" currents from flowing through the high-side FET Q1 and the low-side FET Q2 simultaneously, the timing of switching the high-side FET Q1 and the low-side FET Q2 is controlled such that both the FETs Q1 and Q2 are never on at the same time. To accomplish this, the drive buffer circuit 223 and the inverting buffer circuit 213 are configured to trim the leading edge of the input pulse to guarantee that there is no overlap of the low-side voltage supplied to the gate terminal 224 of the low-side FET Q2 and the high-side voltage supplied to the gate terminal 214 of the high-side FET Q1.

Further, the high-side voltage of the high-side FET Q1 may be electrically coupled to a switch S1 that is controlled by a force commutation circuit 240, which is identical to the force commutation circuit 140 as shown in FIG. 1. The switch S1 may be configured to turn off the high-side FET Q1 when the force commutation circuit 240 is switched on. Although the switch S1 shown in FIG. 2 is a transistor, other types of switches that are responsive to a current may be utilized for switching off the high-side FET Q1 when a commutation current is forced through the high-side FET Q1. A resistor R1 is coupled between the switch S1 and the node N2.

The force commutation circuit 240, shown by the dotted lines, is a detailed version of the force commutation circuit 140 shown in FIG. 1. As described above in regard to FIG. 1, the force commutation circuit 240 is also configured to generate a commutation current and pass the generated commutation current through the high-side FET Q1 from the drain terminal 116 to the source terminal 112, while the high-side FET Q1 is being switched off. If the high-side FET Q1 is switched off while current is flowing through the high-side FET Q1 from the drain terminal 116 to the source terminal 112, the body diode will not be forward biased, and therefore will not require any reverse recovery time.

As further described above with respect to FIG. 1, the high-side FET Q1 is electrically coupled to force commutation circuit 240 that supplies the commutation current. The force commutation circuit 240 includes the commutation diode D1, which is electrically coupled to a pulse current circuit for generating a current pulse. The current pulse may have a duration long enough such that the current passes through the high-side FET Q1 from the drain terminal 116 to the source terminal 112 while the high-side FET Q1 is switched off Once the low-side FET Q2 is switched on, the pulse current circuit 220 is switched off since the inductor current no longer passes through the primary coil 242 of the transformer TX1. As such, the current pulse is characterized as a pulse due to the brief period of time between the switching off of the high-side FET Q1 and the switching on of the low-side FET Q2. The pulse current circuit 220 functions similar to the pulse current source 120 shown in FIG. 1. According to the embodiment shown in FIG. 2, an output of a pulse current circuit 220 is electrically coupled to an anode terminal of the commutation diode at the node N2. A cathode terminal of the commutation diode D1 is electrically coupled to the drain terminal of the high-side FET Q1 and the output terminal 104 at the node N3.

The pulse current circuit 220 includes a commutation FET Q3 electrically coupled to a transformer TX1. The commutation FET Q3 includes a source terminal 232 electrically coupled to ground through a resistor R2, a gate terminal 234 that is electrically coupled to a drive circuit 233 for switching the commutation FET Q3 on or off, and a drain terminal 236 that is electrically coupled to a primary coil of the transformer TX1. The primary coil 242 of the transformer TX1 includes a first end 243 that is electrically coupled to the drain terminal 236 of the commutation FET Q3 and a second end 244 that is electrically coupled to the node N1.

The transformer TX1 also includes a secondary coil 252 that includes a first end 253 that is electrically coupled to the node N1 and a second end 254 that is electrically coupled to the anode terminal of the commutation diode D1 at the node N2.

The commutation diode D1 may be a fast recovery diode, such as a Schottky diode. The commutation diode D1 includes an anode terminal that is electrically coupled to the second end 254 of the secondary coil 252 at the node N2 and a cathode terminal that is electrically coupled to the drain terminal 116 of the high-side FET Q1 and the output terminal of the boost converter at a node N3.

When the commutation FET Q3 is switched on, current from the node N1 begins to flow through the primary coil 242 of the transformer TX1. As a result, a commutation current is generated by the secondary coil 252 of the transformer TX1. The commutation current is then routed to the node N2, from where the commutation current switches off the high-side FET Q1 by supplying a voltage to the switch S1 through R1, and supplies the commutation current through the commutation diode D1. Details regarding the effects of switching on the commutation FET Q3 will be described in further detail during a discussion of the waveforms in FIGS. 3A-3D.

It should be appreciated that the various electrical elements or components shown in the figures and described herein may be replaced by other electrical elements or components that provide similar functionality. Further, the configuration of the various electrical elements described herein is merely an example and it is not intended to limit the scope of the present disclosure in any manner. Additionally, various other electrical elements have not been shown for the sake of simplicity and clarity. It should further be appreciated by those skilled in the art that some of the electrical elements shown in the figures may be removed without altering the scope of the present disclosure.

FIGS. 3A-3D show four waveform diagrams representing the current and voltage measured at various locations of the boost converter circuit shown in FIG. 2 in order to illustrate the functionality of the boost converter during various stages of operation. FIG. 3A shows a first waveform 300A representing the voltage measured at the node N1. FIG. 3B shows a second waveform 300B that represents the current measured at the drain terminal of the low-side FET Q2 at various stages of operation. In the second waveform 300B, a positive current indicates that the current is flowing from the drain terminal 226 to the source terminal 222 of the low-side FET Q2, while a negative current indicates that the current is flowing from the source terminal 222 to the drain terminal 226 of the low-side FET Q2. FIG. 3C shows a third waveform 300C that represents the current measured at the source terminal of the high-side FET at various stages of operation. In the third waveform 300C, a positive current indicates that the current is flowing from the source terminal 112 to the drain terminal 116 of the high-side FET Q1 and a negative current indicates that the current is flowing from the drain terminal 116 to the source terminal 112 of the high-side FET Q1. FIG. 3D shows a fourth waveform 300D that represents the current at the anode terminal of the commutation diode D1 during various stages of operation. All of the waveforms shown in FIGS. 3A-3D are plotted against time. It should be appreciated that the waveforms shown in FIGS. 3A-3D are not drawn to scale, and are shown for the purposes of illustration only.

At t0, the first waveform 300A shows that the voltage at the node N1 is high, indicating that the low-side FET Q2 is switched off. The second waveform 300B shows that there is no current at the drain terminal 226 of the low-side FET Q2, indicating that the low-side FET Q2 is switched off. The third waveform 300C shows that the current at the source terminal 112 of the high-side FET Q1 is high and approaching the switch-off edge current, indicating that the high-side FET Q1 is on and about to switch off. The fourth waveform 300D shows that the current at the anode terminal N2 of the commutation diode D1 is low indicating that the pulse current circuit 220 is switched off.

At t1, the pulse current circuit 220 is switched on via the commutation FET Q3, and the high-side FET Q1 is switched off. As a result of switching off the high-side FET Q1, the inductor current previously flowing through the high-side FET Q1 now flows through the commutation diode D1. In addition, the pulse current circuit 220 supplies the commutation current to the commutation diode D1. As a result, the current flowing through the commutation diode D1 is equivalent to the sum of the inductor current and the commutation current. This is represented by the increase in current at t1 on the fourth waveform 300D. According to embodiments, the magnitude of the commutation current is associated with the length for which the commutation current is supplied to the high-side FET Q1. It should be appreciated that the commutation current flowing in the transformer, TX1, must be larger than the inductor current so that commutation current flows from the drain terminal 116 to the source terminal 112 in the high-side FET Q1.

The negative current shown in 300D will continue to flow until the gate drive circuit is able to turn the high side FET off. The positive value of the current was equivalent to the amount of inductor current passing through the high-side FET Q1 from the source terminal 112 to the drain terminal 116 while the commutation FET Q3 was turned off. The negative value represents the amount of current that passes through the high-side FET Q1 from the drain terminal 116 to the source terminal 112 when the commutation FET Q3 was turned on. The amount of current that passes through the high-side FET Q1 is equal to the difference between the sum of the commutation current and the inductor current, and the current being output at the output terminal 104. From node N3, a portion of the commutation current is supplied to the output terminal, while the remainder of the commutation current passes through the high-side FET Q1 from the drain terminal 116 to the source terminal 112 of the high-side FET Q1.

Once the high-side FET Q1 is switched off at t2 the current at the source terminal of the high-side FET Q1 increases to 0A as shown in the waveform 300C at t2. The current in the commutation diode D1 is now equal to the inductor current.

From t2 to t3, the high-side FET Q1 and the low-side FET Q2 are both switched off. As a result, only inductor current from the inductor L1 flows through the commutation diode D1 during this time. This is reflected in the fourth waveform 300D. This period of time is referred to as the dead time. It is imperative for the safety of the electrical components in the circuit to implement a dead time since operating the circuit while both the high-side FET Q1 and the low-side FET Q2 will result in "shoot through" currents flowing through the FETs, which may cause unnecessary energy losses as well as damage to the components. However, in various embodiments, it may be desirable to reduce the dead time to a minimum.

At t3, the low-side FET Q2 is switched on. As the low-side FET Q2 is switched on, the voltage at the node N1 starts to go to zero as shown by the first waveform 300A. From t3 to t4, waveform 300B shows the low side FET current surge as the low-side FET Q2 must carry both the inductor current and the capacitance charging of the high side FET and commutation diode. Similarly, the waveform 300C shows drain to source current (negative current) as the voltage at node N1 is transitioning from output voltage to zero volts. In various embodiments, the commutation FET Q3 is switched off after the low-side FET Q2 is switched on. In practice, once the low-side FET Q2 is switched off, the voltage entering the primary coil 242 of the transformer TX1 is at 0V. Therefore, no current is being supplied from the transformer TX1 to node N2 once the low-side FET Q2 is switched on. As a result, the functionality of the commutation FET Q3 is not translated to the circuit once the low-side FET Q2 is switched on. Accordingly, the commutation FET Q3 may be switched off at the same time as or after the low-side FET Q2 is switched on.

The negative spike shown in the third waveform 300C represents current flowing out of the source terminal 112 of the high-side FET Q1 through the low-side FET Q2 to ground. This current is a product of the internal capacitance of the high-side FET Q1 and the rate of change of voltage (dv/dt). Similarly, the negative spike shown in the fourth waveform 300D represents current flowing from the anode terminal of the commutation diode D1 through the low-side FET Q2 to ground. This current is a product of the internal capacitance of the commutation diode D1 and the rate of change of voltage (dv/dt). The negative spike of the fourth waveform 300D is significantly smaller than the negative spike of the third waveform 300C since the internal capacitance of the commutation diode D1 is typically much smaller than the internal capacitance of the high-side FET Q1. The positive spike 322 shown in the second waveform 300B represents the currents that flowed from the high-side FET Q1 and the commutation diode D1 flowing through the low-side FET Q2 to ground. It should be appreciated that the positive spike shown in the second waveform 300B is equivalent to the sum of the negative spikes shown in the waveforms 300C and 300D.

At t4, the low-side FET Q2 is completely on and the voltage at the node N1 is now equal to zero. The high-side FET Q1 is switched off and no current is flowing through the high-side FET Q1 and no current is flowing through the commutation diode D1. Also, since the voltage at node N1 is zero, there is no voltage applied to the transformer TX1

From t4 to t5, the low-side FET Q2 remains on and the high-side FET Q1 remains off. At t5, the low-side FET Q2 is switched off, as reflected in the second waveform 300B.

At some point after t5, the low side FET Q2 is first turned off and then the high side FET is turned on. Accordingly, the voltage at the node N1 becomes high again, as represented by the first waveform 300A.

It should be clear from the waveforms that there is no "shoot through" current that flows through the high-side FET Q1 and low-side FET Q2 as the result of the slow recovery characteristics of the body diode 118. Further, because the commutation current flows from the drain terminal 116 to the source terminal 212 during the switch-off edge of the high-side FET Q1, the body diode 118 of the high-side FET Q1 is not forward-biased. As a result, the reverse recovery time is eliminated, thereby allowing the boost converter to operate at higher switching frequencies that previously possible with smaller switching losses than before.

It should be appreciated that various elements, such as resistors, capacitors, inductors, and transistors are not shown for the sake of simplicity. It should also be appreciated by those skilled in the art that such elements may be included according to design requirements.

The subject matter described above is provided by way of illustration only and should not be construed as limiting. Various modifications and changes may be made to the subject matter described herein without following the example embodiments and applications illustrated and described, and without departing from the true spirit and scope of the present invention, which is set forth in the following claims.

What is claimed is:

1. A method of eliminating reverse recovery time in a body diode of a field effect transistor (FET), the method comprising:
    switching the FET on prior to force commutating a current into the body diode;
    maintaining the FET on but not forcing the current into the body diode;
    force commutating, while switching off the FET, the current from a cathode terminal of the body diode to an anode terminal of the body diode; and
    maintaining the FET off and not forcing the current into the body diode.

2. The method of claim 1, wherein the current force commutated from the drain terminal to the source terminal passes through a commutation diode.

3. The method of claim 2, wherein the commutation diode is a Schottky diode.

4. The method of claim 3, wherein the commutation diode is a fast recovery rectifier diode.

5. The method of claim 2, wherein the body diode is a part of a p-type field effect transistor (FET) switch, and wherein the method further comprises switching off the FET switch while force commutating the commutation current from a source terminal of the FET switch to a drain terminal of the FET switch.

6. The method of claim 2 wherein the body diode is a part of an n-type field effect transistor (FET) switch, and wherein the method further comprises switching off the FET switch while force commutating the commutation current from a drain terminal of the FET switch to a source terminal of the FET switch.

7. The method of claim 6, further comprising passing an input current from a current source from the anode terminal of a body diode to the cathode terminal of the body diode prior to force commutating the current from the cathode terminal of the body diode to the anode terminal of the body diode.

8. The method of claim 6, wherein force commutating a current from a drain terminal of the n-type FET switch to a source terminal of the FET switch occurs at a switch-off edge of a rectifier switch cycle associated with a rectifier switch.

9. A synchronous rectifier, comprising:
- a field effect transistor (FET) comprising a gate terminal, a drain terminal, a source terminal, and an intrinsic body diode having a cathode terminal and an anode terminal;
- a commutation diode electrically coupled in parallel to the FET such that a cathode of the commutation diode is electrically coupled to the cathode terminal of the body diode; and
- a selectively controlled force commutation current source electrically coupled to the commutation diode that is configured to force commutate a current from the commutation diode to the FET while the FET is being switched from on to off, such that the current passes from the cathode terminal of the body diode to the anode terminal of the body diode, wherein:
  - during a first phase of operation, both the FET and the selectively controlled force commutation current source are turned off;
  - during a second phase of operation, the FET is turned on and the selectively controlled force commutation current source is turned off;
  - during a third phase of operation, both the FET and the selectively controlled force commutation current source are turned on; and
  - during a fourth phase of operation, the FET is turned off and the selectively controlled force commutation current source is turned on.

10. The synchronous rectifier of claim 9, further comprising a selectively controlled gate voltage source electrically coupled to the gate terminal of the FET that is configured to switch on the FET when the gate terminal is receiving a voltage from the gate voltage source and to switch off the FET when the gate terminal is not receiving a voltage from the gate voltage source.

11. The synchronous rectifier of claim 9, wherein the commutation diode is a fast recovery diode.

12. The synchronous rectifier of claim 9, wherein the current is characterized as a current pulse.

13. The synchronous rectifier of claim 9, wherein the synchronous rectifier is a part of a boost converter or a buck-boost converter.

14. The synchronous rectifier of claim 9, wherein the commutation current passes through the FET at a switch-off edge of a switch cycle of the rectifier.

15. A force commutation assembly, comprising:
- a switching component comprising an intrinsic body diode having a cathode terminal and an anode terminal;
- a commutation diode electrically coupled in parallel to the switching component such that a cathode of the commutation diode is electrically coupled to the cathode terminal of the body diode; and
- a selectively controlled force commutation current source electrically coupled to the commutation diode that is configured to force commutate a current from the commutation diode to the switching component while the switching component is switching from on to off, wherein:
  - during a first phase of operation, both the switching component and the selectively controlled force commutation current source are turned off;
  - during a second phase of operation, the switching component is turned on and the selectively controlled force commutation current source is turned off;
  - during a third phase of operation, both the switching component and the selectively controlled force commutation current source are turned on; and
  - during a fourth phase of operation, the switching component is turned off and the selectively controlled force commutation current source is turned on.

16. The force commutation assembly of claim 15, wherein the commutation diode is a fast recovery diode.

17. The force commutation assembly of claim 15, wherein the selectively controlled force commutation current source causes the switching component to be switched off when the selectively controlled force commutation current source is force commutating a current into the commutation diode.

* * * * *